United States Patent [19]

Harada et al.

[11] Patent Number: 4,543,489
[45] Date of Patent: Sep. 24, 1985

[54] SOLID STATE IMAGE SENSOR

[75] Inventors: Nozomu Harada; Yukio Endo; Okio Yoshida; Yoshiyuki Matsunaga, all of Yokohama, Japan

[73] Assignee: Tokyo Shibaura Denki Kabushiki Kaisha, Japan

[21] Appl. No.: 706,254

[22] Filed: Feb. 28, 1985

Related U.S. Application Data

[63] Continuation of Ser. No. 379,874, May 19, 1982, abandoned.

[30] Foreign Application Priority Data

May 25, 1981 [JP] Japan .................................. 56-78978
Sep. 30, 1981 [JP] Japan ................................ 56-153563

[51] Int. Cl.[4] ............................................. H01J 40/14
[52] U.S. Cl. ...................................... 250/578; 358/213
[58] Field of Search .......................... 250/211 J, 578; 358/212, 213; 357/30, 31, 32, 24 LR

[56] References Cited

U.S. PATENT DOCUMENTS 4,071,853  1/1978  Yamanaka .......................... 358/213
4,081,841  3/1978  Ochi et al. ........................ 250/211 J
4,204,230  5/1980  Sprague ............................. 358/212
4,430,672  2/1984  Berger ............................... 358/213

OTHER PUBLICATIONS

Ochi et al., "A Device Structure and Spatial Spectrum for Checker-Pattern CCD Color Camera," IEEE Transactions on Electron Devices, vol. Ed-25, No. 2, Feb. 1978.

Primary Examiner—David C. Nelms
Attorney, Agent, or Firm—Finnegan, Henderson, Farabow, Garrett & Dunner

[57] ABSTRACT

A solid state image sensor with a plurality of cells comprising a photoelectric converting film formed on a semiconductor substrate for photoelectrically converting incoming light rays to generate signal charge, signal charge storage areas for storing said signal charge formed in said substrate, signal charge read out areas for reading out said signal charge from said storage area, conductor electrodes for making said photoelectric converting film electrically contact with said signal charge storage areas to lead said signal charge from said photoelectric converting film to said storage areas, and series of said conductor electrodes arranged along at least two or more row lines in a matrix of said conductor electrodes being displayed in the row direction by ½ of the length of one electrode one from the other as viewed in the column direction.

6 Claims, 10 Drawing Figures

FIG. 8

| 100An | W1A | Cy1A | W2A | Cy2A |
|---|---|---|---|---|
| 100Bn | W1B | Cy1B | W2B | Cy2B |
| 100A(n+1) | Ye1A | W3A | Ye2A | W4A | Ye3A |
| 100B(n+1) | Ye1B | W3B | Ye2B | W4B | Ye3B |

FIG. 9A

| | R | | R | |
|---|---|---|---|---|
| B | B | B | B |
| G | G | G | G |
| W | Cy | W | Cy |

FIG. 9B

| | | B | | B | |
|---|---|---|---|---|---|
| R | R | R | R | R |
| G | G | G | G | G |
| Ye | W | Y | W | Ye |

SOLID STATE IMAGE SENSOR

This application is a continuation of application Ser. No. 379,874, filed May 19, 1982, now abandoned.

BACKGROUND OF THE INVENTION

The present invention relates to a solid state image sensor.

As known, the solid state image sensor is so arranged as to read out signal charges, which are stored in individual photosensitive cells formed on a semiconductor substrate, following the photoelectric conversion of light, by some means through an output section formed in the semiconductor substrate. In the case of the image pick-up tube, a target film for performing the photoelectric conversion and the storage of the signal charge is formed of a single film. The read out of the signal charge stored in the target film is performed by the scanning electron beam. Since a sheet resistance of a continuous target film is very high, little signal charge is laterally diffused, so that the resolution is almost determined by a diameter of the scanning beam.

In the solid state image sensor, it is impossible to read out the signal charge by the scanning beam, unlike the image pick-up tube. For this reason, the resolution in the image pick-up tube is determined by a density of the photosensitive regions and the signal read out out regions packed in the image sensor.

In one of the known solid state image sensors, the photoelectric conversion is performed in the semiconductor substrate and then the signal charge is stored in the sensor. With this structure, attainment of a given resolution requires a large number of the photosensitive region and provision of an overflow drain region in the substrate in order to prevent an excessive signal charge caused by the photoelectric conversion performed in the substrate from overflowing into the read out region. In this respect, the prior image sensor has a limit in improving the integration density.

To cope with this problem, there has recently been proposed another solid state image sensor with a structure that the photoelectric conversion is executed by the photoelectric converting film and the signal charge generated by the photoelectric converting film is read out by a read out region formed in the substrate. The image sensor will be described referring to FIG. 1. As shown, N+ conductivity regions (first regions) $2_1, 2_2, \ldots$ electrically connected to conductor electrodes $10_1, 10_2, \ldots$, are laterally formed, at fixed intervals in a substrate of the P conductivity type, for example. These N+ conductivity regions $2_1, 2_2, \ldots$ are used for storing the signal charge produced through the photoelectric conversion by a photoelectric converting film 11. The substrate 1 has also N+ conductivity regions $3_1, 3_2, \ldots$ for reading out the signal charge from the N+ regions $2_1, 2_2, \ldots$, which are disposed adjacent to the N+ storage regions $2_1, 2_2, \ldots$ with gate regions $4_1, 4_2, \ldots$ each with a given length interposed therebetween. Stopper regions $5_1, 5_2, \ldots$, formed in the substrate 1, separate one another unit blocks each including a combination of one of these storage regions $2_1, 2_2, \ldots$ and one of these read out regions $3_1, 3_2, \ldots$ Polycrystal silicon gate electrodes $7_1, 7_2, \ldots$ as transfer electrodes are formed over gate insulation films $6_1, 6_2, \ldots$ in the regions of the substrate 1 where the gate regions, the N+ read out regions, and the stopper regions are located. An insulation film 8 made of, for example, is layered over the substrate 1 containing the gate electrodes $7_1, 7_2, \ldots$ Contact holes $9_1, 9_2, \ldots$ allowing the conductor electrodes $10_1, 10_2, \ldots$ to electrically contact with the corresponding storage regions $2_1, 2_2, \ldots$ are formed corresponding to the N+ storage regions $2_1, 2_2, \ldots$ A plurality of the conductor electrodes $10_1, 10_2, \ldots$ formed over the insulation film 8 are disposed separately at given distance. The conductor electrodes $10_1, 10_2, \ldots$ are electrically connected to N+ storage regions $2_1, 2_2, \ldots$, respectively. The photoelectric converting film 11 made of amorphous silicon, for example, for executing the photoelectric conversion, is formed over the entire surface of the insulation film 8. A predetermined voltage is applied to a transparent electrode 12 layered over the photoelectric converting film 11.

In operation, light rays are irradiated over the region of the photoelectric converting film 11 over the conductor electrode $10_1$, under a condition that the predetermined voltage is applied to the transparent electrode 12. The photoelectric converting film 11 is activiated to generate signal charge. The signal charge generated is transferred through the conductor electrode $10_1$ and stored in the N+ storage region $2_1$. For reading out the signal charge stored, a voltage is applied to the gate electrode $7_2$. Upon the application of the voltage, the signal charge is transferred through the gate region $4_1$ to the N+ read out region $3_1$.

With such a structure of the image sensor, the photoelectric converting film 11 formed over the substrate 1 executes the photoelectric conversion. This feature provides the more improvement of the integration density in the image sensor without reducing the resolution than the image sensor of the type in which the photoelectric conversion is performed in the photosensitive region formed in the substrate. In the image sensor as described referring to FIG. 1, when an excessive amount of the signal charge is generated at the time of the photoelectric conversion, the signal charge can be discharged to exterior through the transparent electrode 12 on the photoelectric converting film 11. The result is that there is no need of the overflow drains adjacent to the photosensitive regions in the substrate which would otherwise be required like the image sensor of the in-substrate photoelectric conversion type. This feature also contributes to the improvement of the integration density.

In the image sensor as mentioned above, the N+ storage region $2_1$, the N+ read out region $3_1$, the gate electrode $7_2$, the conductor electrode $10_1$ and the photoelectric converting film 11 make up one cell, or the unit block. A plurality of the cells are arranged in a matrix fashion, as shown in FIG. 2. In FIG. 2, some components have different suffixes although having the same reference numerals as those in FIG. 1, for simplicity of illustration. This is correspondingly applied to the related drawings to be referred to in the specification. In the figure, reference symbols $3a$ to $3d$ designate N+ regions as the read out regions, and $9a$ to $9p$ contact portions for providing electrical contact of the storage regions with the conductor electrodes $10a$ to $10p$. In the image sensor with a matrix pattern of the conductor electrodes $10a$ to $10p$, the light rays incident on the photoelectric converting film (FIG. 1) on the conductor electrodes $10a$ to $10p$ are subjected to the photoelectric conversion. The signal charge resulting from the photoelectric conversion process is transferred to the N+ read out regions $3a$ to $3d$ located under the conductor electrodes $10a$ to $10p$, as indicated by arrows. Picture elements, which will frequently be used in the description to follow, corresponds to a single conductor electrode.

In the NTSC standard television system, the image sensor has a matrix of the conductor electrodes of 500 in the vertical or column direction and 400 in the horizontal or row direction. The image sensor thus constructed has no particular problem in the vertical direction, but has a problem in the horizontal direction. In the horizontal direction, the spatial frequency 400 c/s on the black and white bar pattern reachs the Nyquist limit frequency. When a pattern more detailed than the Nyquist limit frequency is picked up, a false signal called Moiré appears to remarkably damage the reproduced picture on the screen.

Particularly, in the solid state image sensor, the false signal is large. The reason for this is that in this type of the image sensor, the conductor electrodes defining the picture elements are formed independently one another, and, as a result, the output signal and a degree of amplification when the bar pattern at the Nyquist limit frequency is picked up are large. Such phenomenon can be alleviated by merely increasing the number of the picture elements or the conductor electrodes in the horizontal direction. This approach, however, encounters a technical difficulty in the manufacturing stage of the sensor. In addition to this, it suffers from increase of the signal read rate, resulting in difficulty of the circuit design of the drive circuit and the signal processing circuit and the like.

There is another proposal in the solid state image sensor of the in-substrate photoelectric conversion type. In the proposal, a plurality of the conductor electrodes along one row line in the matrix are disposed shifted displaced by ½ picture elements with respect to those on the preceeding and succeeding row lines in the horizontal or row direction. That is, the picture elements are disposed in a zig-zag fashion as viewed in the vertical or column direction.

When two or three image sensors with the structure as mentioned above are combined in a manner that the effective region of one image sensor overlaps with the ineffective region of other sensors the resolution is improved. In the case of one chip image sensor of the zig-zag type, it is difficult to fabricate the sensor of a high integration density. Additionally, in the image sensor of this type, the intensitive region to the light increases, causing the false signal and thus little improving the integration density. To improve the resolution, a plurality of chips must be used so as to obtain the signal charges from the entire area receiving the light rays. This measure essentially leads to increase of the manufacturing cost, and a complicated circuit design of the drive circuit and the signal processing circuit.

SUMMARY OF THE INVENTION

Accordingly, an object of the present invention is to provide a solid state image sensor which is easy to manufacture and can attain a high resolution without the deterioration of the dynamic range and the increase of signal read rate.

According to the present invention, there is provided a solid state image sensor with a plurality of cells comprising a photoelectric converting film formed on a semiconductor substrate for photoelectric converting incoming light rays to generate signal charge, signal charge storage areas for storing the signal charge formed in the substrate, signal charge read out area for reading out the signal charge from the storage area, conductor electrodes for making the photoelectric converting film electrically contact with the signal charge areas to lead the signal charge from the photoelectric converting film to the storage areas, series of the conductor electrodes arranged along at least two or more row lines in a matrix of the conductor electrodes are displaced by a given distance one from the other as viewed in the column direction.

BRIEF DESCRIPTION OF THE DRAWINGS

FIGS. 6, 7 and 8 illustrate conductor electrode patterns of other embodiments of the present invention; and FIGS. 9A and 9B illustrate arrangements of color components of the color signals obtained in the embodiment shown in FIG. 8.

DETAILED DESCRIPTION OF THE PREFERRED EMBODIMENTS

Figure 1:
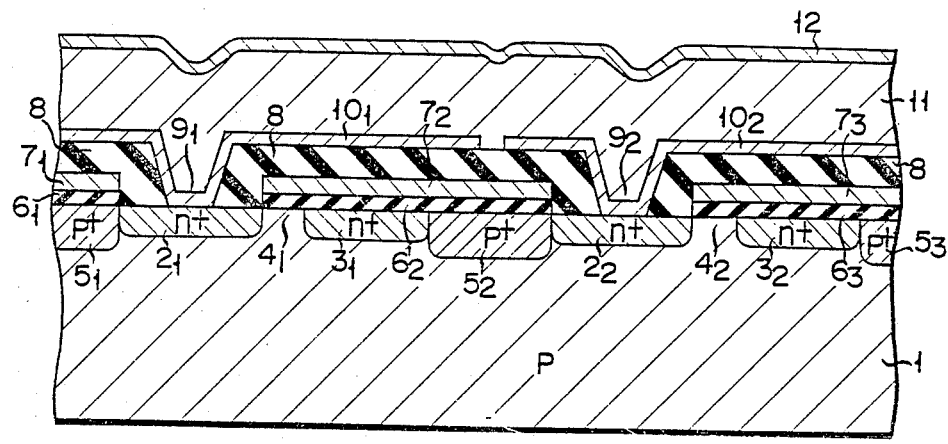
FIG. 1 shows a cross sectional view of a part of a prior solid state image sensor using the photoelectric converting film.
Figure 3:
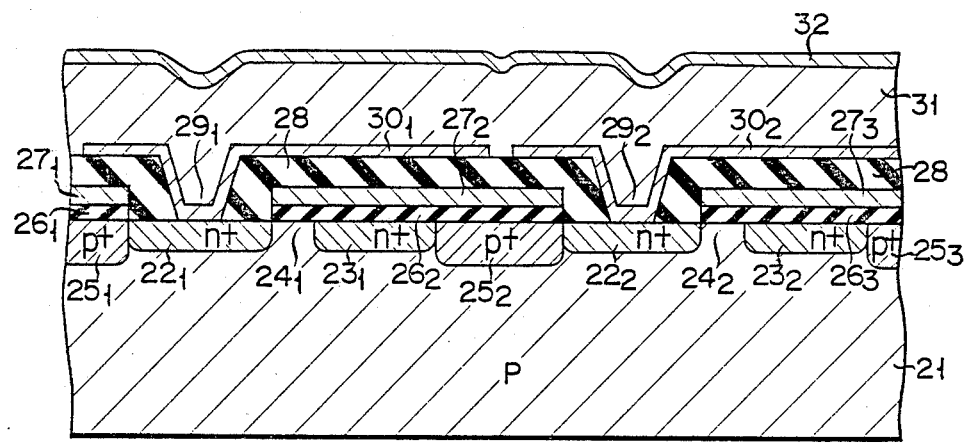
FIG. 3 shows a cross sectional view of a part of an embodiment of a solid state image sensor using the photoelectric conversion type according to the present invention.

FIG. 3 shows a cross sectional view of a portion of one picture element of the solid state image sensor according to the present invention. The cross sectional structure of one picture element is substantially the same as that of the prior image sensor shown in FIG. 1. As shown, N+ conductivity regions (first regions) $22_1$, $22_2$, . . . electrically connected to conductor electrodes $30_1$, $30_2$, . . . , are laterally formed, at fixed intervals in a substrate 21 of the P conductivity type, for example. These N+ regions $22_1$, $22_2$, . . . are used for storing the signal charge produced through the photoelectric conversion by a photoelectric converting film 32. The substrate 21 has also N+ conductivity regions (second N+ region) $23_1$, $23_2$, . . . for reading out the signal charge from the N+ regions $22_1$, $22_2$, . . . , which are disposed adjacent to the N+ storage regions $22_1$, $22_2$, . . . with gate regions each with a given length interposed therebetween. Stopper regions $25_1$, $25_2$, . . . , formed in the substrate 21, separate one another unit blocks each including a combination of one of these storage regions $22_1$, $22_2$, . . . and one of these read out regions $23_1$, $23_2$, . . . Polycrystal silicon gate electrodes $27_1$, $27_2$, . . . as transfer electrodes are formed over gate insulation films $26_1$, $26_2$, . . . in the regions of the substrate 21 where the gate regions, the N+ read out regions, and the stopper regions are located. An insulation film 28 made of, for example, is layered over the substrate 21 containing the gate electrodes $27_1$, $27_2$, . . . Contact holes $29_1$, $29_2$, . . . allowing the conductor electrodes $30_1$, $30_2$, . . . to electrically contact with the corresponding storage regions $22_1$, $22_2$, . . . are formed corresponding to the N+ storage regions $22_1$, $22_2$, ... A plurality of the conductor electrodes $30_1$, $30_2$, ... formed over the insulation film 28 are disposed separately at given distance. The conductor electrodes $30_1$, $30_2$, ... are electrically connected to N+ storage regions $32_1$, $32_2$, ..., respectively. A photoelectric converting film 31 made of, amorphous silicon, for example, for executing the photoelectric conversion, is formed over the entire surface of the insulation film 28. A predetermined voltage is applied to a transparent electrode 32 layered over the photoelectric converting film 31.

Figure 2:
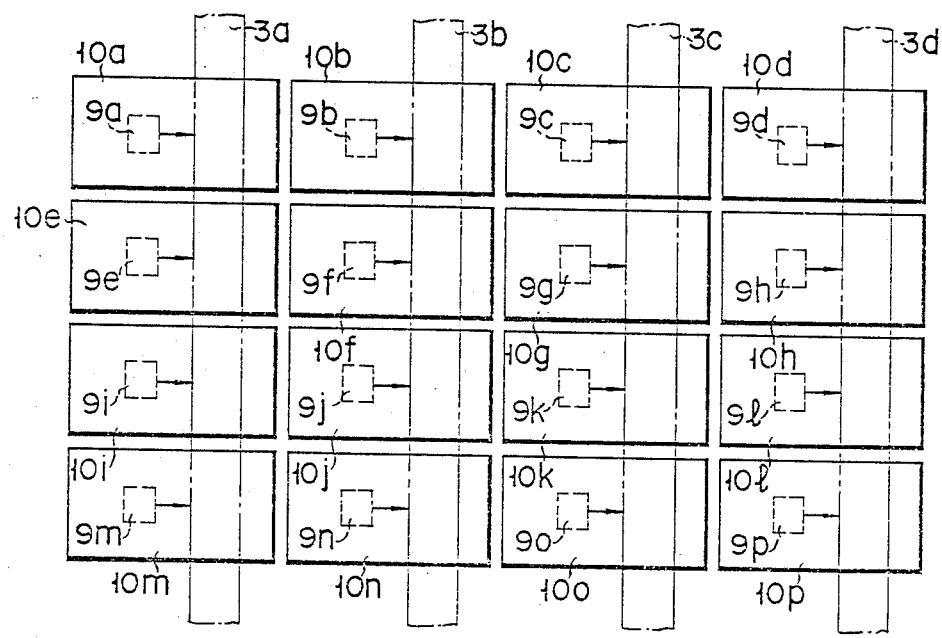
FIG. 2 shows a plan view of a prior solid state image sensor as shown in FIG. 1, which is particularly for illustrating a pattern of the conductor electrodes.
Figure 4:
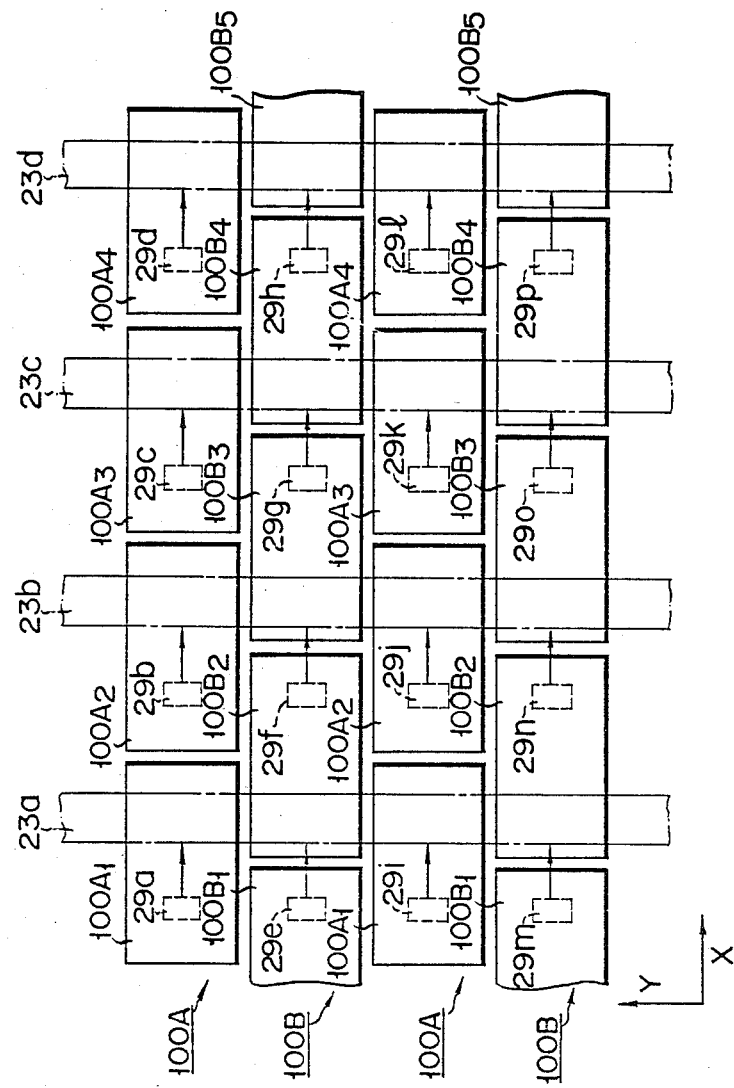
FIG. 4 is a plan view of a solid state image sensor as shown in FIG. 3, which is particularly for illustrating a pattern of conductor electrodes.

Turning now to FIG. 4, there is shown a plan view of an image sensor according to the present invention. Particularly, this drawing illustrates a pattern of the conductor electrodes. As seen from the figure, the solid state image sensor has substantially the same structure as those of the FIGS. 1 and 2 image sensors, except that an arrangement of the conductor electrodes (corresponding to the picture elements) are different from those of the prior sensors. In the image sensors shown in FIGS. 3 and 4, series of conductor electrodes 100A1 to 100An (generally designated as 100A) arranged along row lines of a matrix of the conductor electrodes for a field A are shifted or displaced by about ½ length of the conductor electrode with respect to those electrodes B1 to Bn (generally designated as 100B) along the row lines for a field B. In the figure, reference numerals 23a to 23d designate N+ regions for the read out region, and reference numerals 29a to 29p contact holes.

In operation, light rays are incident on the photoelectric converting film 31 on the conductive electrodes 100A and 100B, with a predetermined voltage being applied to the transparent electrode 32. The photoelectric converting film 31 is activated to generate signal charge. The signal charge generated are stored into the storage regions 22 through the contact holes. The signal charge stored is read out into the N+ read out region through the gate regions 24, as indicated by arrows, if a given voltage is applied to the gate electrodes 27. In the image sensor of the present embodiment, the resolution in the horizontal direction can be improved to an extent of the adjustment of the ½ shift length in the conductor electrode arrangement, when compared with the image sensors shown in FIGS. 1 and 2. In the prior art shown in FIGS. 1 and 2, when a more detailed pattern than a pattern density of the conductor electrodes arranged in the row direction (which is proportional to the number of the conductor electrodes per unit length and defines the Nyquist limit frequency), the image pattern closer to the adjacent conductor electrodes provides a false signal of Moiré. In the meantime, in the present embodiment, the conductor electrodes of the field A are shifted from those of the field B by the ½ electrode length, as described above. The center of one conductor electrode of one field is located at the gap between the adjacent conductor electrodes of the other field, as viewed in FIG. 4. Therefore, in picking up a more detail image pattern than the pattern density of the conductor electrodes arranged in the row direction, the false image can remarkably be reduced compared to the prior image sensor, resulting in a substantial improvement of the resolution.

As described above, the present embodiment employs exactly the same structure of the gate electrodes, the N+ storage region, the N+ read out regions, the contact holes, and the like as that of the prior art, except the minor change in the arrangement of the conductor electrodes defining the picture elements. Therefore, the present embodiment encounters no special difficulty in its manufacturing. The number of the picture elements is the same as that of the prior one. This feature provides no increase of the read out rate and no difficulty in the signal processing.

Figure 5:
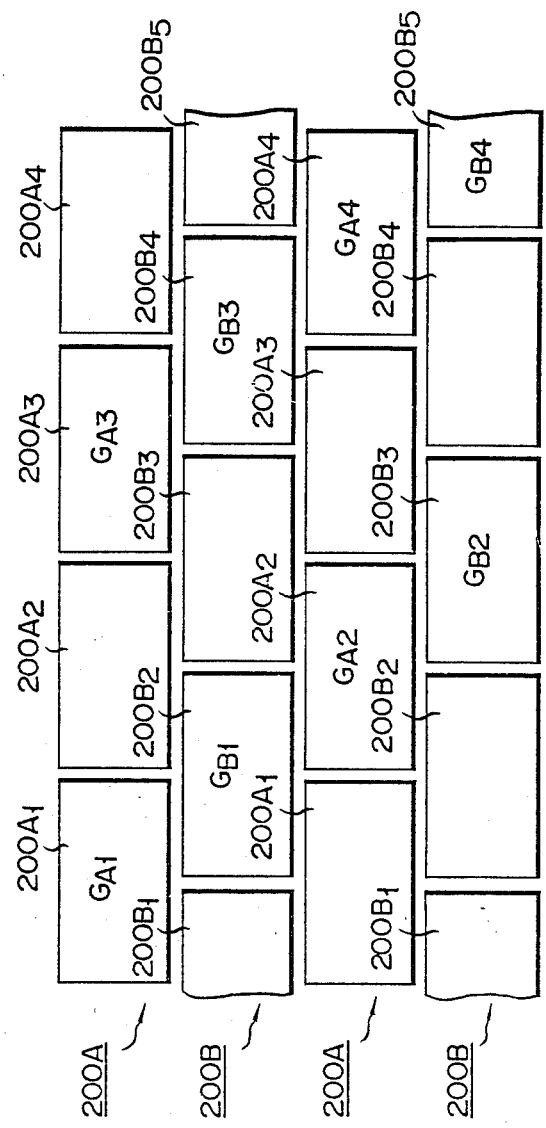
FIG. 5 is an explanatory view for illustrating a pattern of the conductor electrodes when the image sensor according to the present invention is applied for a color image sensor.

Turning to FIG. 5, there is shown a pattern of conductor electrodes when a solid state image sensor according to the present invention is applied to the color image sensor. Also in the present embodiment, the conductor electrodes 200A1 to 200An arranged on row lines for the field A are horizontally from those B1 to Bn for the field B by a ½ length of the conductor electrode, as shown in FIG. 5. The center of each conductor electrode of one field is located substantially at the center of the gap between the adjacent conductor electrodes on the same row line of the other field. In the arrangement of the conductor electrodes, color filters allowing green light to pass are respectively disposed along an oblique line connecting the conductor electrode GA1 on the first row line in the field A, the electrode GB1 on the first row line in the field A, the electrode GA2 on the second row line, and the electrode GB2 on the second row line, another oblique line connecting the electrode GA3 of the field A, the electrode GB3 of the field B, the electrode GA4 and the electrode GB4, and subsequent those oblique lines. With provision of the green color filters, green color signals can be obtained from the cells located corresponding to those conductor electrodes along the oblique lines. The vertical correlation processing is applied to the green color signals thus obtained. A color picture formed through the image sensor has a high resolution without the reduction of the integration density and the difficulty in the signal processing, as in the case of the monochromatic image sensor shown in FIGS. 3 and 4. While the FIG. 5 embodiment employs one chip color image sensor, the same thing is true for the color image sensors of two or more chips. In using the multi-chip type color image sensor, the resolution is further improved if these chips are spatially shifted properly. The green color passing filters used in the above-mentioned embodiment may be substituted by a filter allowing its complementary color to pass, if a subsequent signal processing for the complementary color is done in a proper way.

Figure 6:
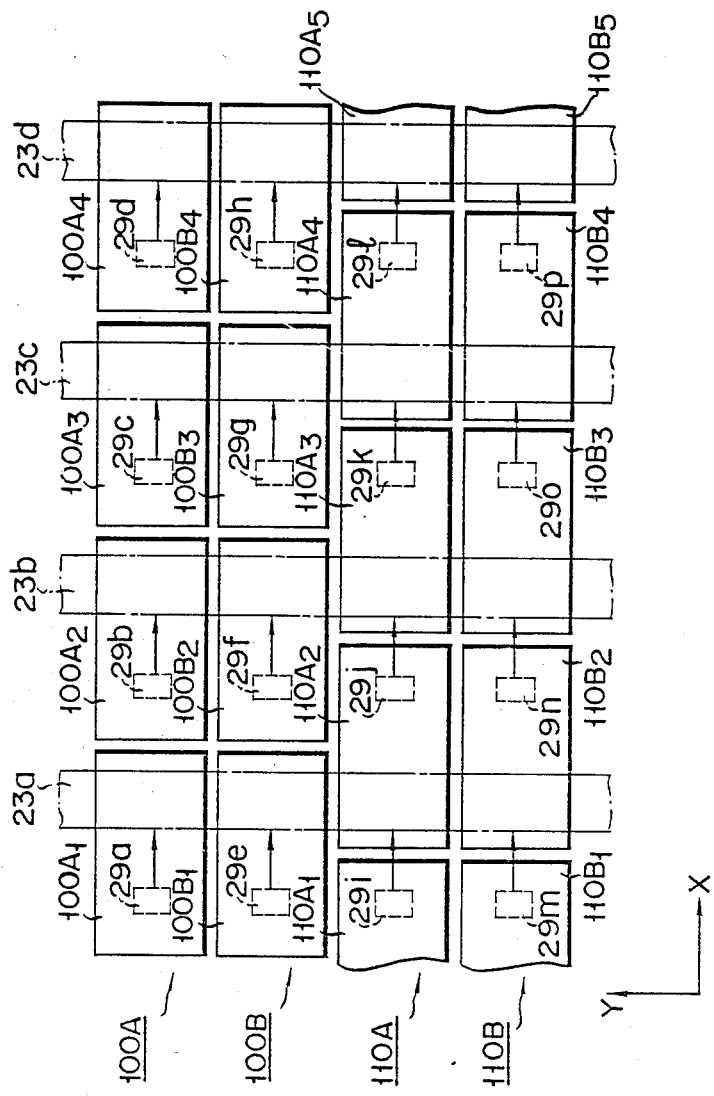

FIG. 6 shows a further embodiment of an image sensor according to the present invention. As shown, the conductor electrodes 100A1 to 100An for the field A and the electrodes 100B1 to 100Bn for the field B arranged along a couple of adjacent row lines are shifted from those electrodes 110A1 to 110An and 110B1 to 110Bn along another couple of row lines by a ½ length of each conductor electrode. In the present embodiment, each of the couples of electrode series 100A and 100B, and 110A and 110B makes up a unit electrode series. This is different from the electrode arrangement of the FIGS. 3 and 4 embodiment. No further explanation of the present invention will be given for simplicity. It is evident that the present embodiment can attain the same effects as those of the FIGS. 3 and 4 embodiment.

Figure 7:
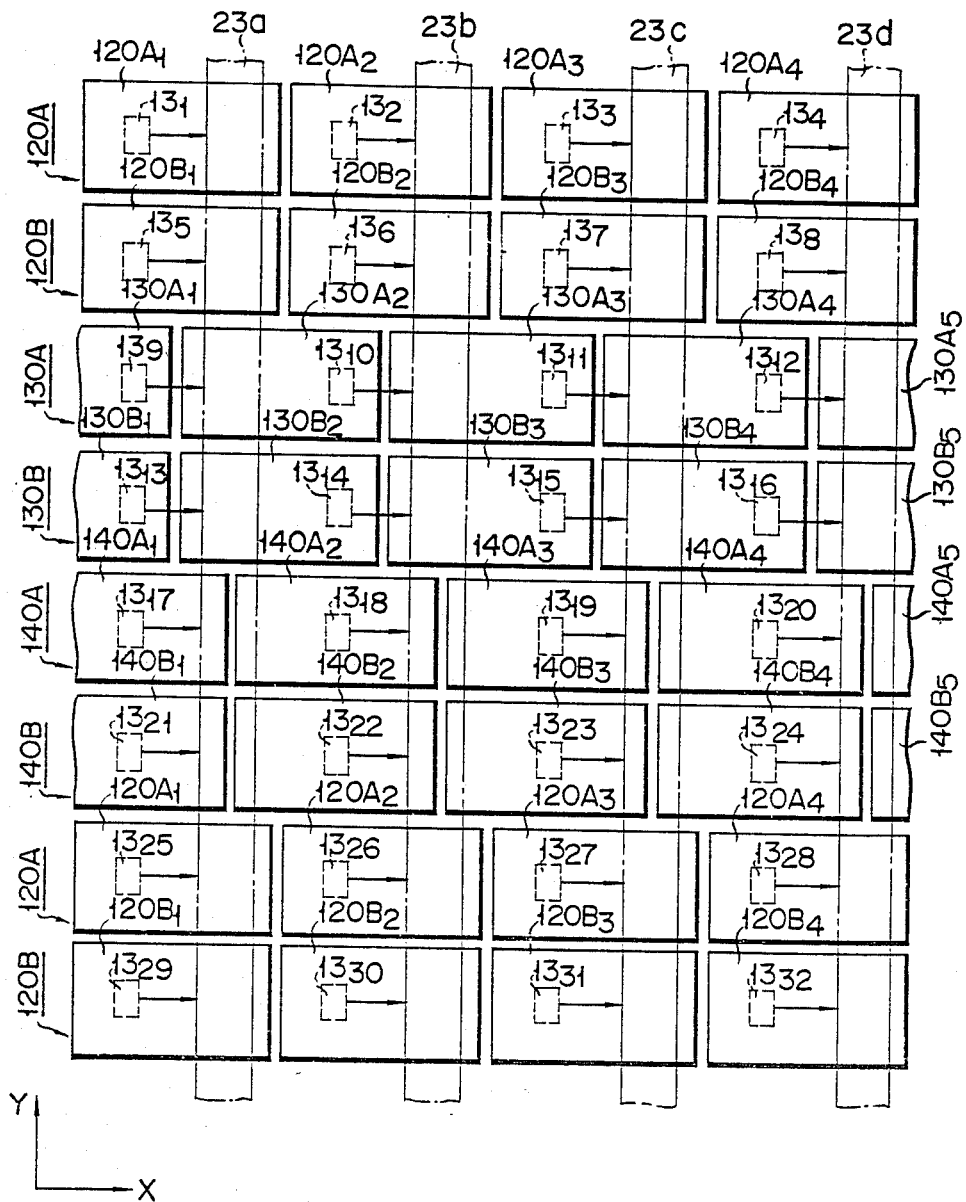

A modification of the arrangement of the conductor electrodes in FIG. 6 is illustrated in FIG. 7. In this arrangement, three adjacently disposed unit electrode series of the electrodes 120A and 120B along a couple of the first row lines, the electrodes 130A and 130B along a couple of the second row lines, and the electrodes 140A and 140B along a couple of the third row lines are properly shifted one another so that the corresponding electrodes of one unit electrode series are disposed facing the gaps between the adjacent electrodes on the row lines of other unit electrode series as viewed in the vertical direction, as shown. The same effects as those in the previous embodiments can be secured.

In FIG. 8 and FIGS. 9A and 9B, there are shown one another embodiment of the present invention when the image sensor with the electrode pattern as shown in FIG. 7 is applied for a color image sensor. In this embodiment, transparent filter W1A, W2A, W1B, W2B, W3A, W4A, W3B, and W4B are respectively disposed on or above conductor electrodes 100An1, 100An3, 100Bn1, 100Bn3, 100A(n+1)2, 100A(n+1)4, 100B(n+1)2, and 100B(n+1)4 in the conductor electrode series of the fields A and B, as shown. Cyan filters Cy1A, Cy2A, Cy1B, and Cy2B allowing green and blue to transmit are provided on or above the conductor electrodes 100An2, 100An4, 100Bn2, and 100Bn4, respectively. Yellow filters Ye1A, Ye2A, Ye3A and Ye1B, Ye2B and Ye3B are provided on or above the conductor electrodes 100A(n+1)1, 100A(n+1)3, 100A(n+1)5, 100B(n+1)1, 100B(n+1)3, and 100B(n+1)5, respectively. With such an arrangement, the electrodes 100An for the field A and the electrodes 100B for the field B produce color signals transmitted through the transparent filter and through the Cyan filters alternately. Similarly, the electrodes 100A(n+1) and 100B(n+1) produce color signals transmitted through the transparent filters and the Cyan filters alternately. FIG. 9A shows an arrangement of the color lights obtained from the electrodes 100An and 100Bn and FIG. 9B shows an arrangement of the color lights obtained from the electrodes 100A(n+1) and 100B(n+1). In FIGS. 9A and 9B, the color light transmitted through the transparent filter is represented by a (R+B+G) signal, and the color light transmitted through the Cyan filter by a (B+G) signal, the color light transmitted through the yellow filter by an (R+G) signal. As seen from the figures, the (B+G) signals are obtained from all the cells for the electrodes 100An and 100Bn and the (R+B+G) signals are obtained from every other cells. In those electrodes 100A(n+1) and 100B(n+1), the (R+G) signals are obtained from all the cells and the (R+B+G) signals are obtained from every other cells.

The output signals Sn and S(n+1) obtained from the unit electrode series of the electrodes 100An and 100Bn and another electrode series of the 100A(n+1) and 100B(n+1) are $$Sn = G + B + \frac{R}{2} + \frac{R}{2} \sin \omega cT \qquad (1)$$

$$S(n + 1) = G + R + \frac{B}{2} + \frac{B}{2} \sin\left(\omega cT + \frac{\pi}{2}\right) \qquad (2)$$

whereh $\omega c$ is an angular frequency $\frac{1}{2}$ the frequency for reading out the signal charge from the cells. When these output signals Sn and S(n+1) given by the equations (1) and (2) is passed through a low pass filter for reducing the angular frequency $\omega c$, the signals given by the following equations are obtained.

$$Yn = G + B + \frac{R}{2} \qquad (3)$$

$$Y(n + 1) = G + R + \frac{B}{2} \qquad (4)$$

When the signals Sn and S(n+1) are passed through the band pass filters with the center frequency $\omega c$ and the band width $\omega c/2$, the signals given by the following equations are obtained.

$$Cn = \frac{R}{2} \qquad (5)$$

$$C(n + 1) = \frac{R}{2} \qquad (6)$$

If the signals Cn and C(n+1) are added to the signals Yn and Y(n+1), the luminance signals Yn' and Y(n+1)' are obtained and given by $$Yn' = G + B + R \qquad (7)$$

$$Y(n+1)' = G + R + B \qquad (8)$$

The equation (7) shows that the luminance signals defining a resolution are derived from all the cells in the electrode series 100A and 100B, and the equation (8) shows that the luminance signals defining the resolution are derived from the electrode series 100A(n+1) and 100B(n+1). The luminance signals thus obtained are corrected by the subsequent signal processing by the displacement between the unit electrode series in the electrode arrangement. As a result, a reproduced picture with a high resolution can be obtained.

In the FIG. 8 embodiment, one chip type of the image sensor is applied to the color image sensor, but the multi-chip type of the image sensor may of course be applied to the color image sensor. In this case, if these chips are arranged spatially displaced, the resolution of the picture is further improved.

In all the above-mentioned embodiments, the electrical contact of the conductor electrodes with the N+ storage regions in the substrate is attained by the PN junction. The electrical contact may be made by the Schottky barrier. Further, the interline transfer CCD, employed for the signal charge reading out in the above-mentioned embodiments, may be replaced by the MOS system of the XY address type, the charge prime device system of the line address type or a system using resistor gate type image sensor elements.

As seen from the foregoing, the present invention, which has a mere modification of the arrangement of the conductor electrodes can attain a high resolution of the picture free from the narrowing of the dynamic range, and the complicated circuit design of the signal processing arising from the increased rate of the signal charge reading out, while allowing the use of the prior manufacturing technique.

What we claim is:

1. A solid state image sensor with a plurality of cells having picture element areas comprising:
   a semiconductor substrate;
   a photoelectric converting film formed on said semiconductor substrate for photoelectrically converting incoming light rays to signal charge;
   signal charge storage areas formed in said substrate for storing said signal charge;
   signal charge read out areas for reading out said signal charge from said storage area; and
   a matrix of conductor electrodes each defining all the areas corresponding to said picture element areas, said picture element areas acting as effective areas for collecting said signal charge formed in said photoelectric converting film, said conductor electrodes making said photoelectric converting film electrically contact said signal charge storage areas and conducting signal charge to said storage areas; said conductor electrodes being arranged along at least two row lines with gaps between the electrodes in each row in the matrix of said conductor electrodes, the conductor electrodes in a first row line being each displaced by the same amount relative to the conductor electrodes in a second row line adjacent said first row line as viewed in the column direction, and the conductor electrodes in said first row line each having a zone overlapping the conductor electrodes in said second row line and completely overlapping the gaps between the electrodes in the second row as viewed in the column direction.

2. A solid state image sensor according to claim 1, further comprising at least four series of conductor electrodes, two adjacent series of said conductor electrodes forming a first set and the two series of said conductor electrodes adjacent to said first set forming a second set, and the conductor electrodes in said first set being each displaced by a specific distance with respect to the conductor electrodes in said second set as viewed in the column direction.

3. A solid state image sensor according to claim 2, wherein the specific distance of said displacement is ½ the length of one said conductor electrode as viewed in the column direction.

4. A solid state image sensor according to claim 1, further comprising at least six series of said conductor electrodes, two adjacent series of said conductor electrodes forming a first set, the two series of said conductor electrodes adjacent to said first set forming a second set, and the two series of said conductor electrodes adjacent to said second set excluding said first set forming a third set, said first set of conductor electrodes being displaced by a first distance with respect to said second set of conductor electrodes and also displaced by a second distance with respect to said third set of conductor electrodes as viewed in the column direction.

5. A solid state image sensor according to claim 1 further including color filtering means for allowing at least a specific color to pass therethrough, said color filtering means being arranged on said conductor electrodes.

6. A solid state image sensor according to claim 1, 2, 3 or 4, further including color filtering means for allowing at least a specific color to pass therethrough, said color filtering means being disposed on said conductor electrodes located in a specific direction between the row and column directions.

* * * * *